United States Patent
Simoni et al.

(10) Patent No.: US 9,383,382 B2
(45) Date of Patent: Jul. 5, 2016

(54) MICROELECTROMECHANICAL SENSOR WITH OUT-OF-PLANE SENSING AND PROCESS FOR MANUFACTURING A MICROELECTROMECHANICAL SENSOR

(71) Applicant: STMicroelectronics S.r.l., Agrate Brianza (IT)

(72) Inventors: Barbara Simoni, Bareggio (IT); Carlo Valzasina, Gessate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 495 days.

(21) Appl. No.: 13/779,002

(22) Filed: Feb. 27, 2013

(65) Prior Publication Data

US 2013/0220016 A1    Aug. 29, 2013

(30) Foreign Application Priority Data

Feb. 28, 2012 (IT) .............................. TO2012A0179

(51) Int. Cl.
| | |
|---|---|
| G01P 15/125 | (2006.01) |
| B81C 1/00 | (2006.01) |
| G01P 15/08 | (2006.01) |
| B81B 3/00 | (2006.01) |

(52) U.S. Cl.
CPC ............ *G01P 15/125* (2013.01); *B81B 3/0094* (2013.01); *B81C 1/00198* (2013.01); *G01P 15/0802* (2013.01); *B81B 2201/0235* (2013.01); *B81B 2201/0242* (2013.01); *B81B 2201/033* (2013.01); *B81B 2203/04* (2013.01); *B81B 2203/058* (2013.01)

(58) Field of Classification Search
CPC .................................................. G01P 15/125
USPC ........................................................ 73/514.32
See application file for complete search history.

(56) References Cited

U.S. PATENT DOCUMENTS

| | | | | |
|---|---|---|---|---|
| 6,612,029 B2 * | 9/2003 | Behin | ................... | B81B 3/0021 29/830 |
| 6,744,173 B2 * | 6/2004 | Behin | ................... | B81B 3/0021 310/309 |
| 7,107,846 B2 * | 9/2006 | Kano | ................... | G01P 15/125 73/514.32 |
| 7,258,010 B2 * | 8/2007 | Horning | ................ | H02N 1/008 73/504.14 |
| 7,469,588 B2 * | 12/2008 | LaFond | ............... | G01P 15/0802 73/514.32 |
| 7,690,254 B2 * | 4/2010 | Pilchowski | ........ | G01C 19/5719 73/504.14 |

OTHER PUBLICATIONS

Selvakumar, A., et al., "A High-Sensitivity Z-Axis Capacitive Silicon Microaccelerometer with a Torsional Suspension," Journal of Microelectromechanical Systems, IEEE Service Center, U.S., vol. 7, No. 2, Jun. 1, 1998, pp. 192-200.

* cited by examiner

Primary Examiner — Hezron E Williams
Assistant Examiner — Mark A Shabman
(74) Attorney, Agent, or Firm — Seed Intellectual Property Law Group PLLC

(57) ABSTRACT

A microelectromechanical sensor that in one embodiment includes a supporting structure, having a substrate and electrode structures anchored to the substrate; and a sensing mass, movable with respect to the supporting structure so that a distance between the sensing mass and the substrate is variable. The sensing mass is provided with movable electrodes capacitively coupled to the electrode structures. Each electrode structure comprises a first fixed electrode and a second fixed electrode mutually insulated by a dielectric region and arranged in succession in a direction substantially perpendicular to a face of the substrate.

21 Claims, 9 Drawing Sheets

MICROELECTROMECHANICAL SENSOR WITH OUT-OF-PLANE SENSING AND PROCESS FOR MANUFACTURING A MICROELECTROMECHANICAL SENSOR

BACKGROUND

1. Technical Field

The present disclosure relates to a microelectromechanical sensor with out-of-plane sensing and to a process for manufacturing a microelectromechanical sensor.

2. Description of the Related Art

As is known, the use of microelectromechanical systems (MEMS) has increasingly continued to spread in various sectors of technology and has yielded encouraging results especially in the production of inertial sensors, micro-integrated gyroscopes, and electromechanical oscillators for a wide range of applications.

MEMS of this type are usually based upon microelectromechanical structures comprising at least one mass connected to a fixed substrate by springs and movable with respect to the substrate according to pre-set degrees of freedom. The movable mass and the substrate are capacitively coupled through plurality of respective electrodes set facing one another so as to form capacitors. The movement of the movable mass with respect to the stator, for example on account of an external stress, modifies the capacitance of the capacitors, whence it is possible to trace back to the relative displacement of the movable mass with respect to the fixed body and hence to the force applied.

In a first family of microelectromechanical sensors (also referred to as "sensors with in-plane sensing"), the movable mass is constrained in such a way as to translate or rotate parallel to the substrate. More precisely, in devices of this type the movable mass can translate along one or two axes parallel to the substrate, or else rotate about an axis perpendicular thereto. The electrodes are generally obtained by definition of conductive layers formed on the substrate and possibly total or partial removal of sacrificial layers.

A second family of microelectromechanical sensors (also referred to as "sensors with out-of-plane sensing") comprises devices in which the movable mass is constrained so that its distance from the substrate can vary in response to stresses according to one axis. In particular, the movable mass can translate along an axis perpendicular to the substrate or else rotate about an axis parallel to the substrate. The electrodes generally face one another, through the space that separates the movable mass from the substrate, so as to alternatively approach or recede according to the movements of the movable mass. To form the electrodes, conductive layers are laid and shaped, which are separated from a sacrificial dielectric layer. The movable mass is formed on the conductive layer formed last. Removal of the sacrificial layer allows for release of the movable mass, creating a gap between the movable mass itself and the substrate.

There then exist microelectromechanical sensors in which the movable mass has more than one degree of freedom. In this case, sensing can be of the in-plane type along a first axis and of the out-of-plane type along a second axis.

Sensors with sensing of the out-of-plane type present limits due to the fact that the dimensions of the gap and the distance between the electrodes are basically imposed by the thickness of the sacrificial layer. On account of the structure of known sensors of the out-of-plane type, there is hence little freedom in the choice of the geometry of the electrodes and of the dimension of the gap. Since the performance (in particular, sensitivity, accuracy, and full-scale values) are affected to a determining extent by these parameters, also the variety of microelectromechanical sensors with sensing of the out-of-plane type is limited.

BRIEF SUMMARY

One or more embodiments of the present disclosure is to provide a microelectromechanical sensor and a process for manufacturing a microelectromechanical sensor that enable the one or more limitations described above to be overcome.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
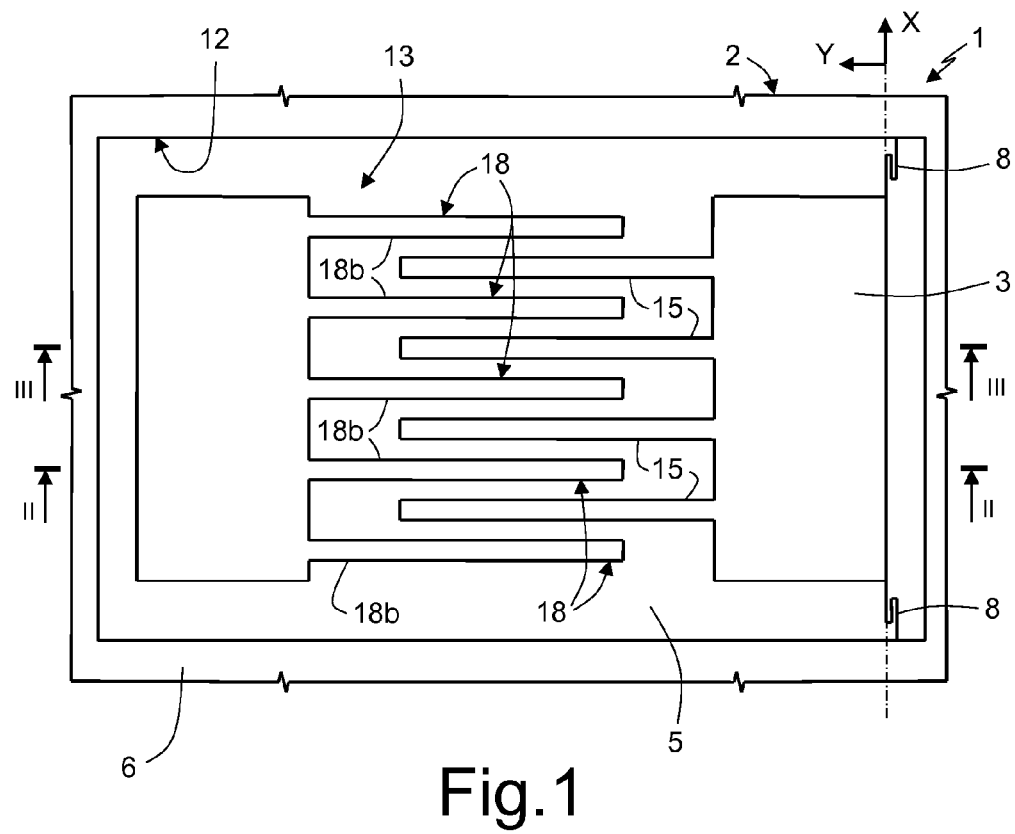
FIG. 1 is a top plan view, simplified and with parts removed for clarity, of a microelectromechanical sensor in accordance with one embodiment of the present disclosure.
Figure 2:
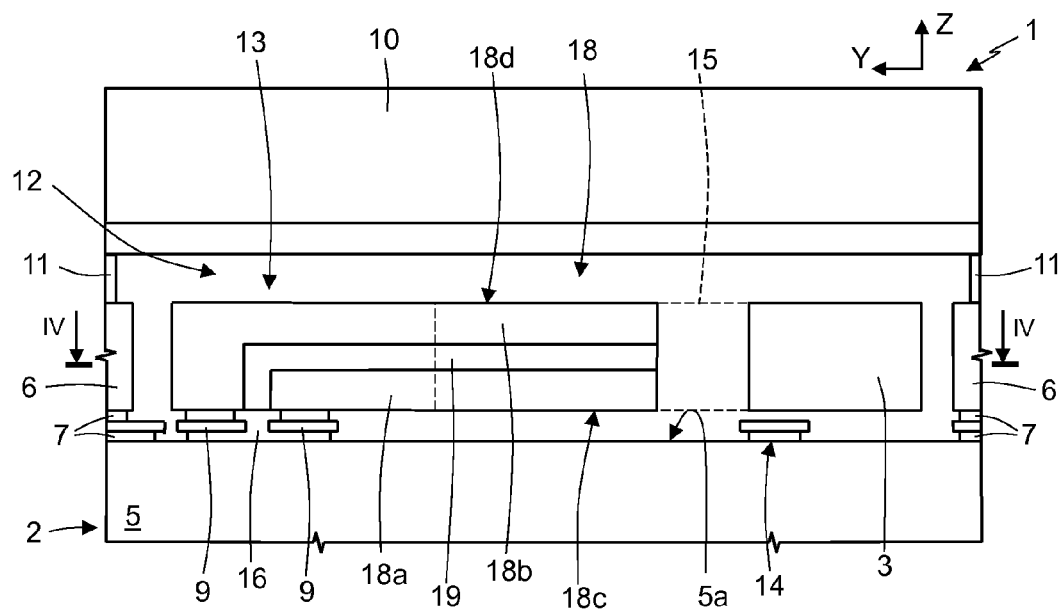
FIG. 2 is a cross-sectional view through the sensor of FIG. 1, taken along the line II-II of FIG. 1.
Figure 3:
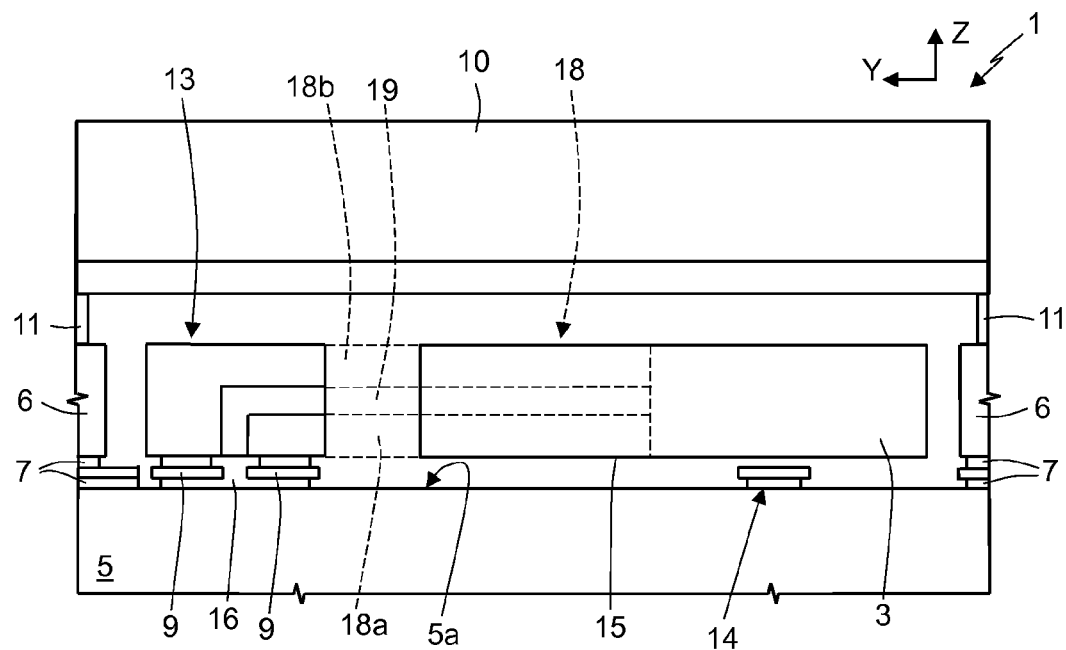
FIG. 3 is a cross-sectional view through the sensor of FIG. 1, taken along the line III-III of FIG. 1.
Figure 4:
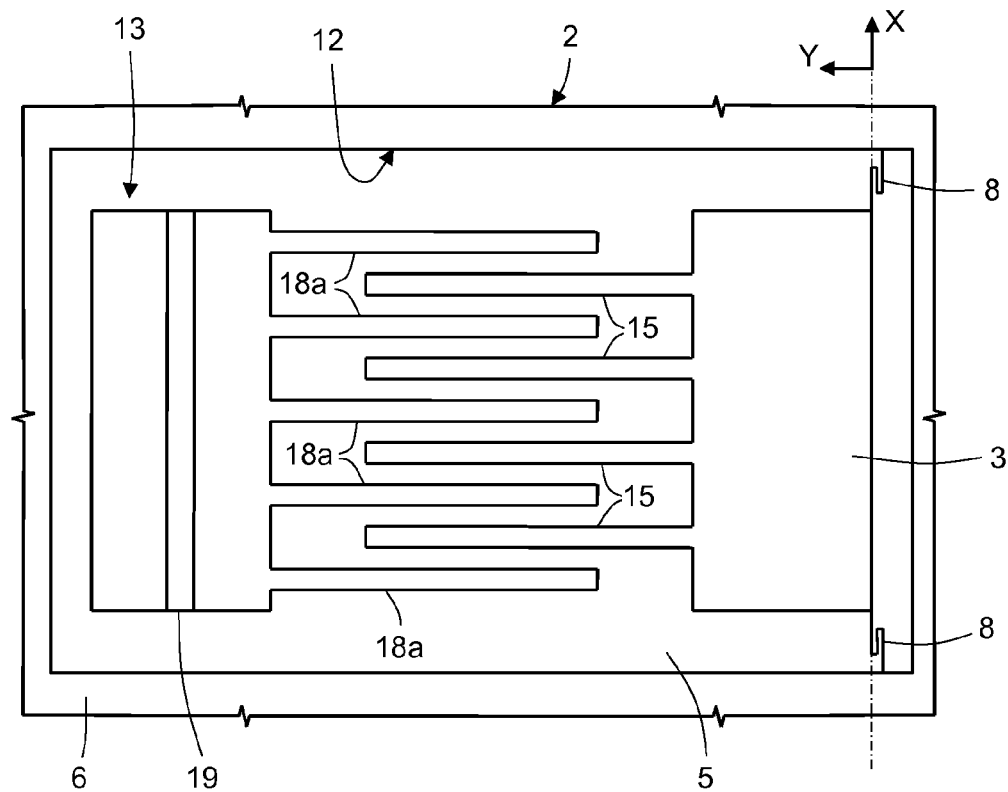
FIG. 4 is a top plan view of the sensor of FIG. 1, taken along the line IV-IV of FIG. 2.

In FIGS. 1-5, a microelectromechanical sensor with sensing of the out-of-plane type in accordance with one embodiment of the present disclosure is illustrated in a simplified way and designated as a whole by the reference number 1. The microelectromechanical sensor 1 comprises a supporting structure 2 and a sensing mass 3, which is mechanically connected to the supporting structure 2 so as to have one or more defined degrees of freedom (one rotational degree of freedom in the embodiment described herein).

The supporting structure 2 comprises a substrate 5, for example made of silicon or other monocrystalline semiconductor material, and a structural layer 6. The structural layer 6 is separated from the substrate 5 by a dielectric layer 7, embedded in which are portions of electric connection lines 9, for example, made of polycrystalline silicon.

A cap 10 is bonded to the structural layer 6 by a bonding layer 11, which in one embodiment is made of gold. Alternatively, the bonding layer 11 could be made of other material, such as, for example, a conductive paste. Furthermore, in the case where an electric interface between the supporting structure 2 and the cap 10 is not necessary, the supporting structure 2 and the cap 10 may be bonded by direct bonding.

The substrate 5, the structural layer 6, and the cap 10 define a cavity 12, which accommodates the sensing mass 3 and a set of fixed electrodes 13.

The sensing mass 3 is made of semiconductor material, in particular polycrystalline silicon and is connected to the structural layer 6 by elastic suspension elements 8, which, in one embodiment, enable rotation of the sensing mass 3 about a non-barycentric axis X, parallel to a face 5a of the substrate 5 delimiting the cavity 12. In the absence of stresses, the sensing mass 3 is withheld in a position of equilibrium by the elastic suspension elements 8, whilst it can oscillate in the case of rotations of the supporting structure 2 about the axis X or else in the case of translation along an axis Z perpendicular to the face 5a of the substrate 5. The distance between the sensing mass 3 and the substrate 2 thus varies in response to stresses that cause rotations of the sensing mass 3 about the axis X (rotations of the supporting structure 2 about the axis X or accelerations along the axis Z). The oscillations of the sensing mass 3 are limited by a buffer 14, which may, for example, be made of dielectric material (silicon oxide) and semiconductor material (polysilicon) or entirely dielectric material.

The sensing mass 3 is furthermore provided with movable electrodes 15 in the form of flat plates that extend in comb fashion parallel to a plane defined by the axis Z and by an axis Y, perpendicular to the axes X, Z and to the face 5a of the substrate 5. In the embodiment described, the axis Y identifies the main dimension of the movable electrodes 15.

The set of fixed electrodes 13 has an anchoring portion (FIGS. 1 and 4) rigidly connected to the substrate 2 by anchorages 16 (FIGS. 2 and 3), here made of dielectric material, and comprises electrode structures 18, which are also in the form of flat plates that extend in comb fashion from the anchoring portion, parallel to the plane defined by the axis Z and by the axis Y. Furthermore, the movable electrodes 15 and the electrode structures 18 extend towards one another and are comb-fingered so that each movable electrode 15 has a portion arranged between a respective pair of electrode structures 18. In one embodiment, the movable electrodes 15 and the electrode structures 18 substantially have the same dimension in one direction of the axis Z.

Each electrode structure 18 comprises a first fixed electrode 18a and a second fixed electrode 18b, mutually insulated by a dielectric region 19. In one embodiment, the first fixed electrode 18a and the second fixed electrode 18b are both made of polycrystalline silicon. The first fixed electrode 18a, the dielectric region 19, and the second fixed electrode 18b form in this order a stack in a direction parallel to the axis Z (and hence perpendicular to the face 5a of the substrate 5). The first fixed electrode 18a occupies a portion of the fixed electrode structure 18 that extends between the dielectric region 19 and a margin 18c facing the substrate 5. The second fixed electrode 18b occupies, instead, a portion of the electrode structure 18 that extends between the dielectric region 19 and a margin 18d opposite to the margin 18c and facing the cap 10.

Through conductive regions 20a, 20b, for example made of polysilicon, the first fixed electrode 18a, and the second fixed electrode 18b are connected to respective electric connection lines 9, which are in turn fixed to the substrate 2 by the anchorages 16.

Figure 5:
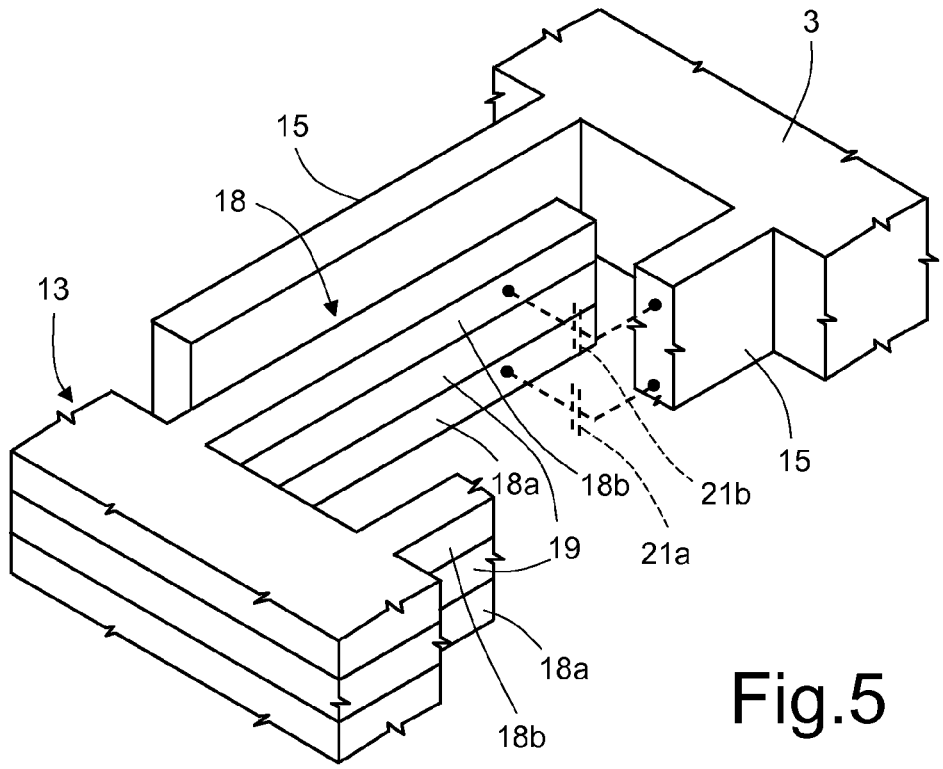
FIG. 5 is a perspective view three-quarters from above of an enlarged detail of the sensor of FIG. 1.
Figure 6:
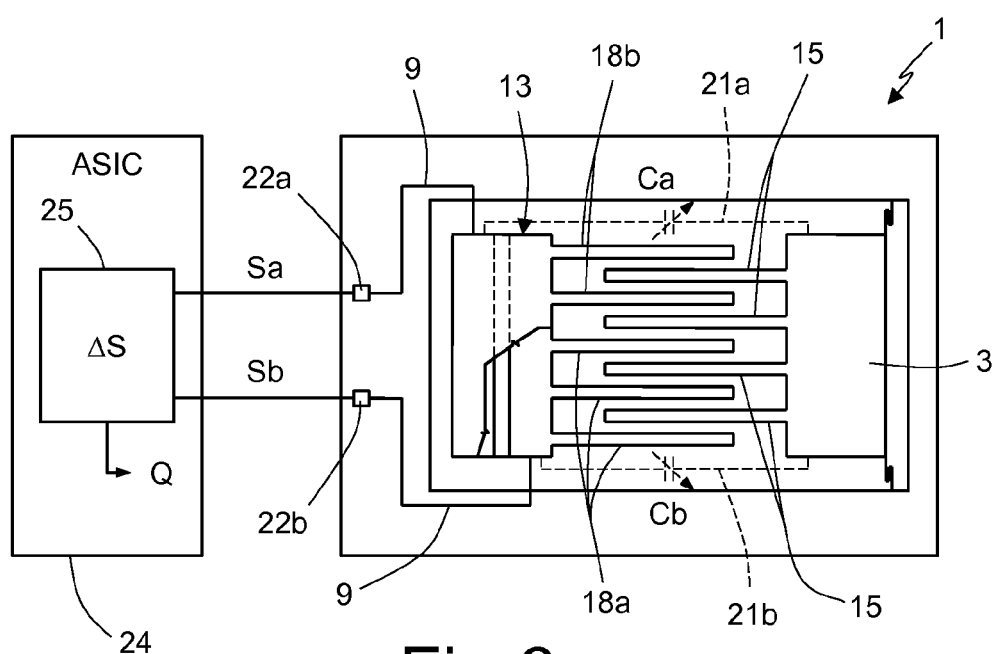
FIG. 6 is a simplified electric diagram of the sensor of FIG. 1.

As illustrated in a simplified way in FIGS. 5 and 6, in each electrode structure 18 the first fixed electrode 18a and the second fixed electrode 18b form, respectively, a first capacitor 21a and a second capacitor 21b with corresponding movable electrodes 15. In this way, the sensing mass 3 is capacitively coupled to the first fixed electrodes 18a and to the second fixed electrodes 18b, respectively, with overall capacitances Ca, Cb (FIG. 6). The first fixed electrodes 18a and the second fixed electrodes 18b are connected to respective contact pads 22a, 22b for supplying respective sensing signals Sa, Sb to a control device 23 (ASIC, Application Specific Integrated Circuit), equipped with a processing unit 25. The sensing signals Sa, Sb indicate the respective overall capacitances Ca, Cb of the first capacitor 21a and of the second capacitor 21b.

Figure 7:
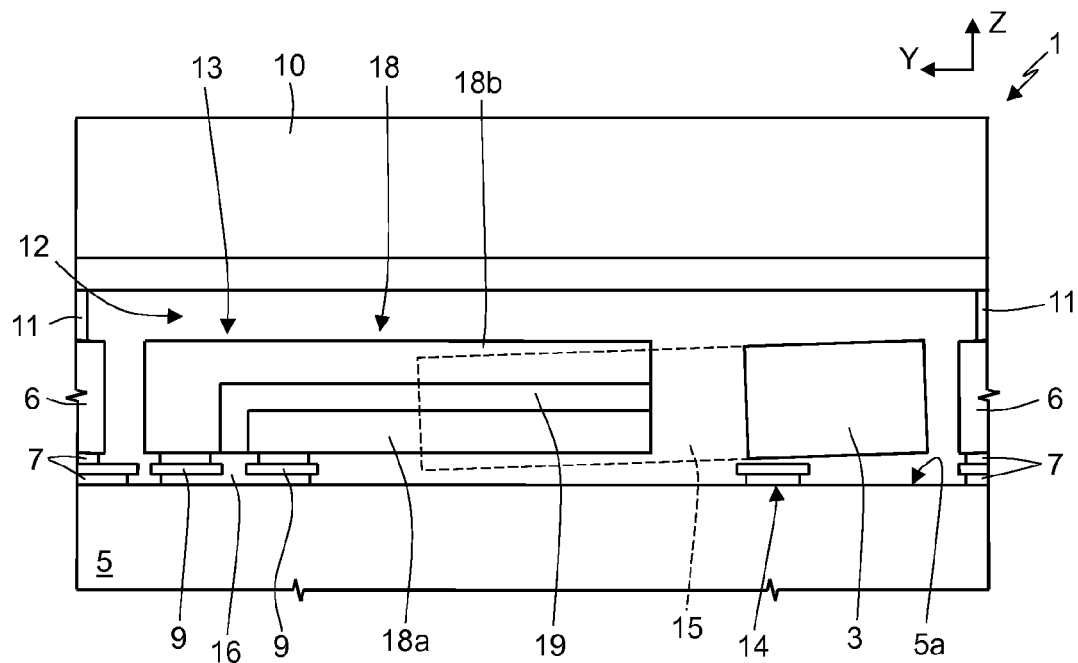
FIG. 7 shows the view of FIG. 2, in a different operating configuration.

Thanks to the conformation of the electrode structures 18, the processing unit 24 of the control device 23 can determine the amplitude and the sign of a observed quantity Q (in this case the acceleration along the axis Z or, alternatively, the angular acceleration about the axis X) from the difference ΔS between the sensing signals Sa, Sb. At rest, in fact (FIGS. 2 and 3), the overall capacitances Ca, Cb of the first capacitor 21a and of the second capacitor 21b are maximum, because in each electrode structure 18 the area of the first fixed electrode 18a and of the first fixed electrode 18b facing the movable electrode 15 is maximum. When the sensing mass 3 turns in one direction (in particular, in a counterclockwise direction in the example of FIG. 7, as a result of an acceleration of the sensor 1 in a direction parallel to the axis Z), the overall capacitance Ca of the first capacitor 21a remains unvaried, whilst the overall capacitance Cb of the second capacitor 21b decreases. Following upon rotation, in fact, the entire useful portion of the first fixed electrode 18a remains facing the corresponding movable electrode 15; the second fixed electrode 18b, instead, only partially faces the corresponding movable electrode 15, to an extent given by the amount of the rotation. When the rotation has an opposite direction, the overall capacitance Cb of the second capacitor 21b remains unvaried, whilst the overall capacitance Ca of the first capacitor 21a decreases in proportion to the amount of the rotation.

The conformation of the electrode structures 18 thus enables determination of both the amplitude and the sign of the observed quantity Q from the difference ΔS between the sensing signals Sa, Sb.

In a different embodiment (FIG. 8), the elastic suspension elements 8 are shaped so that the sensing mass 3 translates along an axis perpendicular to the surface 5a of the substrate 5 (axis Z).

Figure 8:
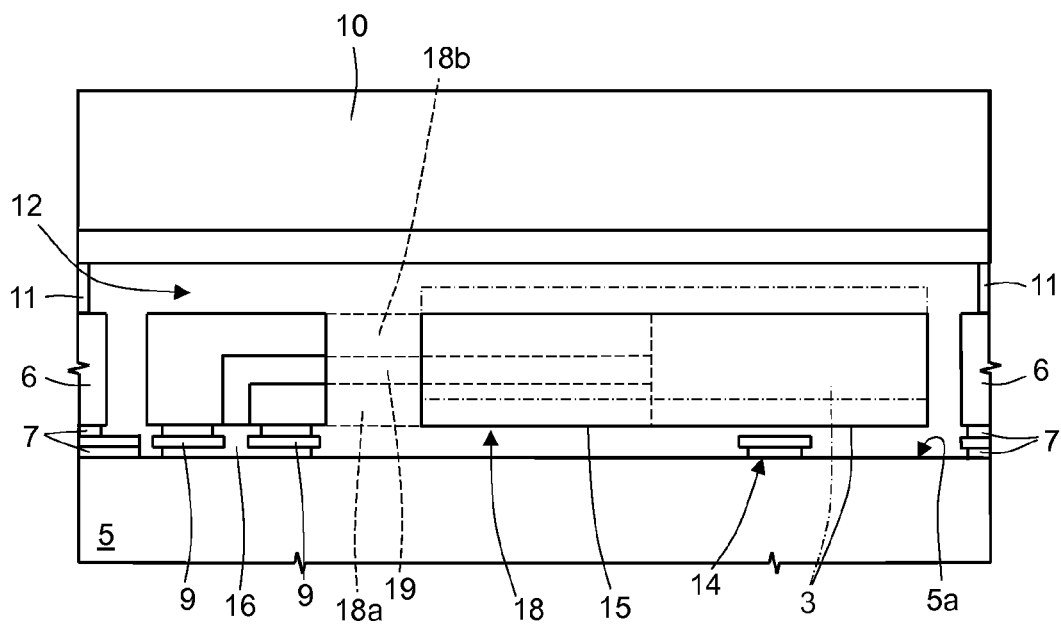
FIG. 8 is a cross-sectional view through a microelectromechanical sensor in accordance with a different embodiment of the present disclosure.
Figure 9:
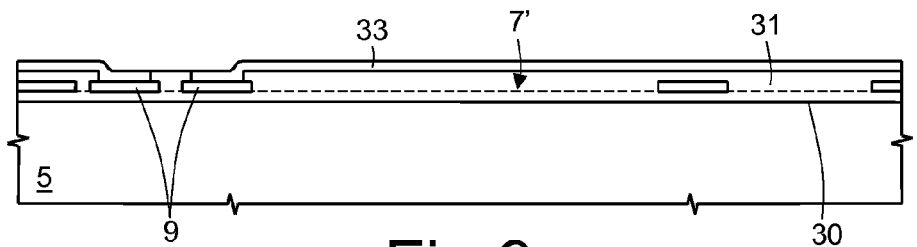
FIGS. 9-12 are cross-sectional views of a semiconductor wafer in successive processing steps of a process for manufacturing a microelectromechanical sensor in accordance with one embodiment of the present disclosure.
Figure 10:
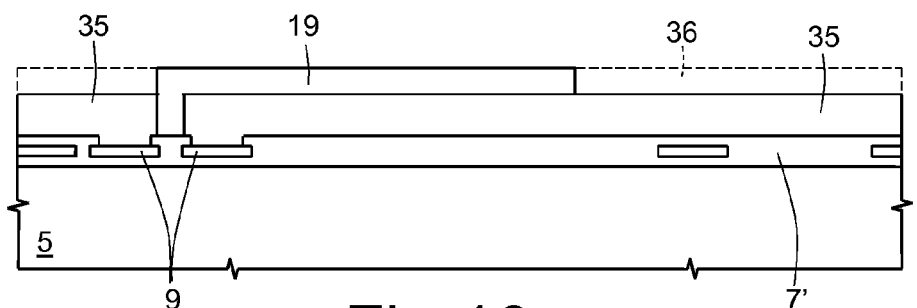
Figure 11:
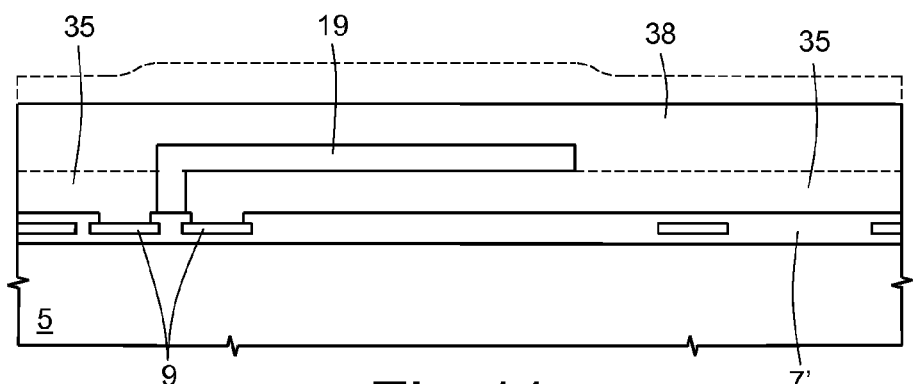
Figure 12:
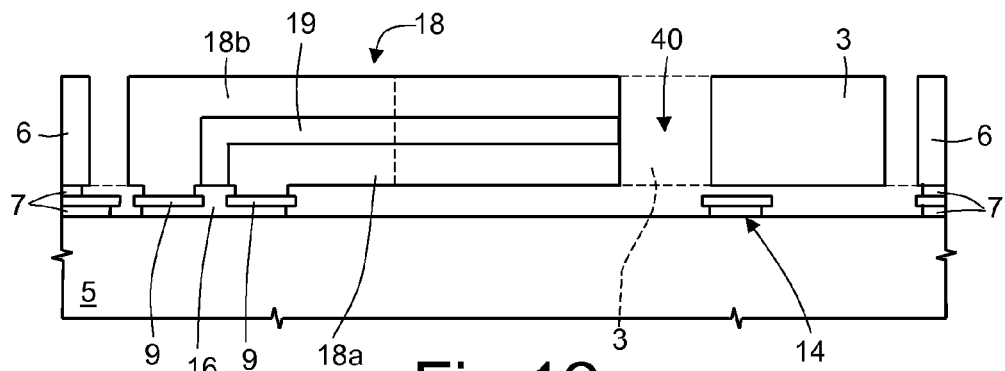

In FIG. 8, the dashed-and-dotted line represents the sensing mass 3 in a position different from the resting position, for example in response to a linear acceleration of the sensor 1 in a direction opposite to the axis Z.

In an embodiment not illustrated, the elastic suspension elements 8 are shaped so as to enable a further degree of freedom between the sensing mass 3 and the supporting structure 2. In particular, the sensing mass 3 can translate along the axis Y, in addition to rotating about the axis X (or translating along the axis Z) as described previously. In this case, the processing unit 25 of the control device 23 is configured to determine the acceleration along the axis Z from the difference ΔS between the signals Sa, Sb, as already described, and is furthermore configured to determine the acceleration of the sensor 1 along the axis Y from the sum of the signals Sa, Sb. In practice, the conformation of the electrode structures 18 enables use of the sensing mass 3 both for out-of-plane sensing of the acceleration along the axis Z and for in-plane sensing of the acceleration along the axis Y, substantially as in sensors of a comb-fingered type.

A process for manufacturing the sensor 1 is illustrated in FIGS. 9-12.

Initially, formed on the substrate 5 are a first dielectric layer 30 and a semiconductor layer of polycrystalline silicon, which is defined by a photolithographic process to provide the electric connection lines 9. A second dielectric layer 31 is deposited and forms, with the first dielectric layer 30, a sacrificial layer 7' that incorporates the electric connection lines 9. Next, the sacrificial layer 7' is etched to expose portions of the electric connection lines 9 that are to anchor the electrode structures 18. A seed layer 33 of polycrystalline silicon is deposited on the surface of the sacrificial layer 7'.

Then (FIG. 10), a first pseudo-epitaxial layer 35 is grown from the seed layer 33, with a controlled thickness equal to the desired height for the first fixed electrodes 18a (alternatively, the first pseudo-epitaxial layer 35 can be grown with a greater thickness and subsequently planarized until the desired thickness is obtained). The first pseudo-epitaxial layer 35 extends in a substantially continuous and uniform way, and is selectively removed by an anisotropic etch (trench etch) between the portions of electric connection lines 9 not coated by the second dielectric layer 31. Next, a third dielectric layer 36 (illustrated dashed in FIG. 10) is formed on the first pseudo-epitaxial layer 35 and fills the interruptions, in particular between the portions of the electric connection lines 9 not coated by the second dielectric layer 31. The third dielectric layer 36 is then shaped, and residual portions define the dielectric regions 19.

A second pseudo-epitaxial layer 38 (FIG. 11) is grown up to an initial thickness (represented dashed) after a further germ layer (not illustrated) has been deposited. The second pseudo-epitaxial layer 38 is then planarized until the portion that overlies the dielectric regions 19 and is designed to define the second fixed electrodes 18b (FIGS. 2 and 3) has substantially the same thickness as the first pseudo-epitaxial layer 35. The first pseudo-epitaxial layer 35 and the second pseudo-epitaxial layer 38 form the structural layer 6.

By an anisotropic etch perpendicular to the face 5a of the substrate 5 (trench etch, FIG. 12), the sensing mass 3 and the set of electrodes 13 are formed and separated from the rest of the structural layer 6. In particular, between the sensing mass 3 and the set of electrodes 13 a gap 40 is formed, the configuration of which determines the dimensions of the movable electrodes 15 and of the electrode structures 18 and their capacitive coupling (in other words, the capacitances Ca, Cb of the capacitors 21a, 21b).

Next, the sacrificial layer 7' is partially removed by a time-controlled isotropic etch. In this way, the dielectric material is removed only to a minimal extent under the electric connection lines 9, which remain fixed to the substrate 2. Residual portions of the sacrificial layer 7' form the dielectric layer 7, the anchorages 16, and part of the buffers 14.

The configuration of the electrode structures 18, with the first fixed electrodes 18a and the second fixed electrodes 18b arranged above and separated from the insulating regions 19 is compatible with the use of a trench etch to provide the gap 40 that delimits the sensing mass 3 and determines the capacitive coupling with the fixed electrodes. It is thus possible to define the shape and dimensions of the gap 40 with a high degree of freedom and, at the same time, obtain a compact structure that enables a differential reading of the capacitances.

FIGS. 13-16 show a further embodiment, according to which a microelectromechanical sensor 100 with sensing of the out-of-plane type comprises a supporting structure 102 and a sensing mass 103, which is mechanically connected to the supporting structure 102 so as to have two defined degrees of freedom. In the embodiment described herein, in particular, the sensing mass 103 has a rotational degree of freedom and a translational degree of freedom.

The supporting structure 102 comprises a substrate 105, for example made of silicon or other monocrystalline semiconductor material, and a structural layer 106. The structural layer 106 is separated from the substrate 105 by a dielectric layer 107, embedded in which are portions of electric connection lines 109.

A cap 110 is joined to the structural layer 106 by a bonding layer 111.

The substrate 105, the structural layer 106, and the cap 110 define a cavity 112, which accommodates the sensing mass 103 and two sets of fixed electrodes 113, 114.

The sensing mass 103 is made of semiconductor material, in particular polycrystalline silicon, and is connected to the structural layer 106 by elastic suspension elements 108, which are shaped so as to enable movements of the movable mass according, respectively, to a first degree of freedom and a second degree of freedom.

In particular, in one embodiment the elastic suspension elements 108 enable rotation of the sensing mass 103 about a non-barycentric axis X, parallel to a face 105a of the substrate 105 delimiting the cavity 112, and translation along a second axis Y, which is also parallel to the face 105a of the substrate 105 and perpendicular to the axis X. Alternatively, the elastic suspension elements 108 may allow the sensing mass 103 to translate along an axis Z perpendicular to the axes X, Y. In the absence of stresses, the sensing mass 103 is withheld in a position of equilibrium by the elastic suspension elements 108, whereas it can oscillate in the case of rotations of the supporting structure 2 about the axis X or else, in the case of translation, along the axis Y. The oscillations of the sensing mass 103 rotating about the axis X are limited by buffers 116.

The sensing mass 103 is furthermore provided with two sets of movable electrodes 115a, 115b in the form of flat plates that extend in comb fashion parallel to a plane defined by the axis Z and by an axis Y perpendicular to the axes X, Z. Furthermore, the two sets of movable electrodes 115a, 115b are substantially symmetrical and extend in opposite directions with respect to the axis X. In the embodiment described, the axis Y identifies the main dimension of the movable electrodes 115a, 115b.

Figure 13:
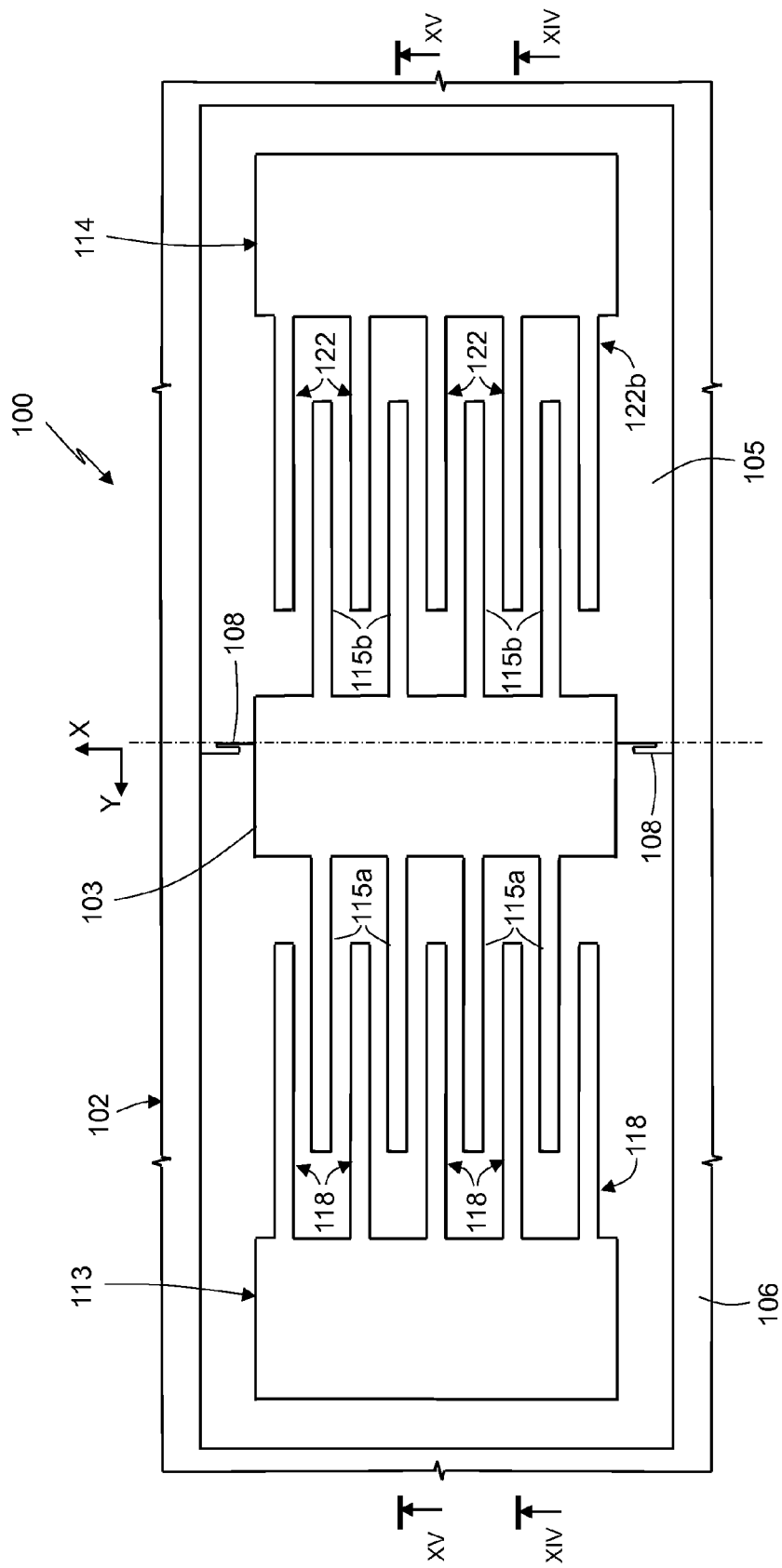
FIG. 13 is a simplified top plan view, with parts removed for clarity, of a microelectromechanical sensor in accordance with one further embodiment of the present disclosure.
Figure 14:
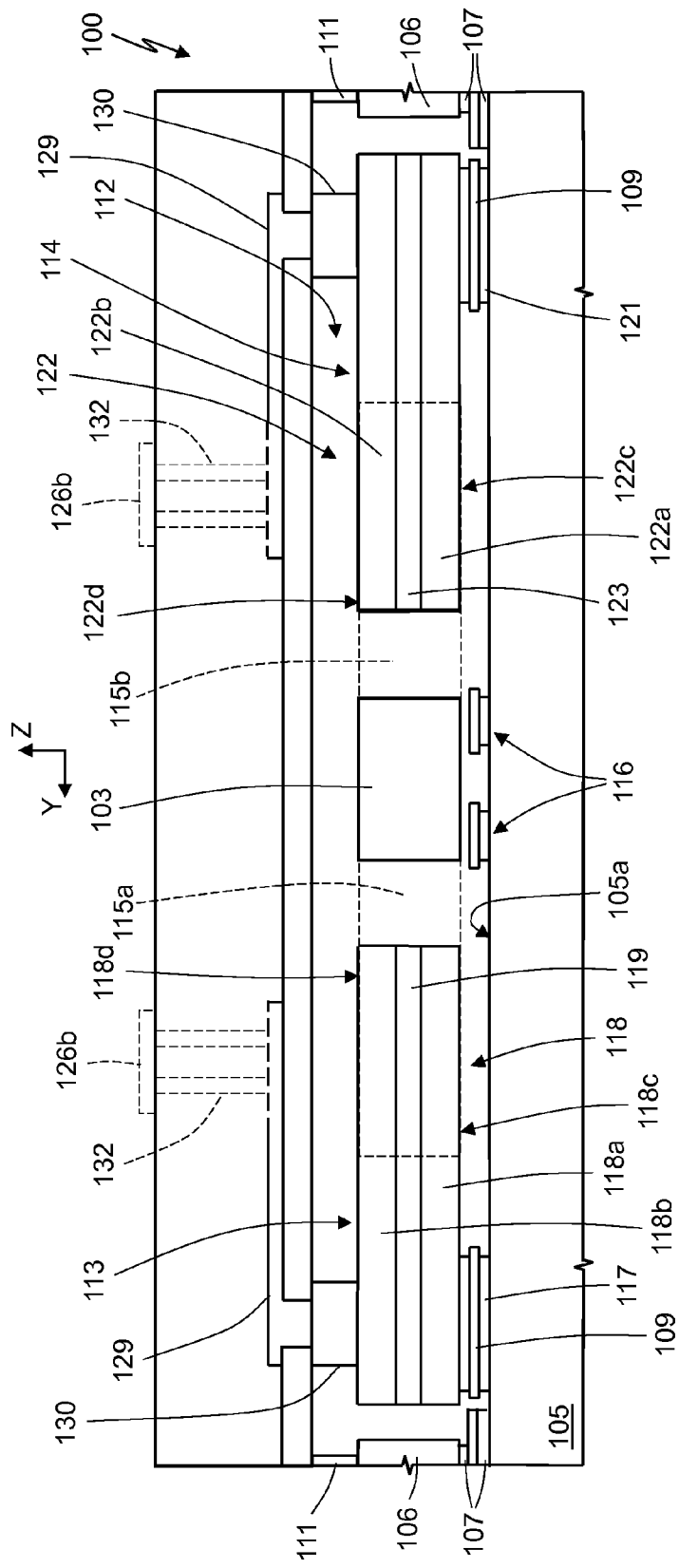
FIG. 14 is a cross-sectional view through the sensor of FIG. 13, taken along the line XIV-XIV of FIG. 13.
Figure 15:
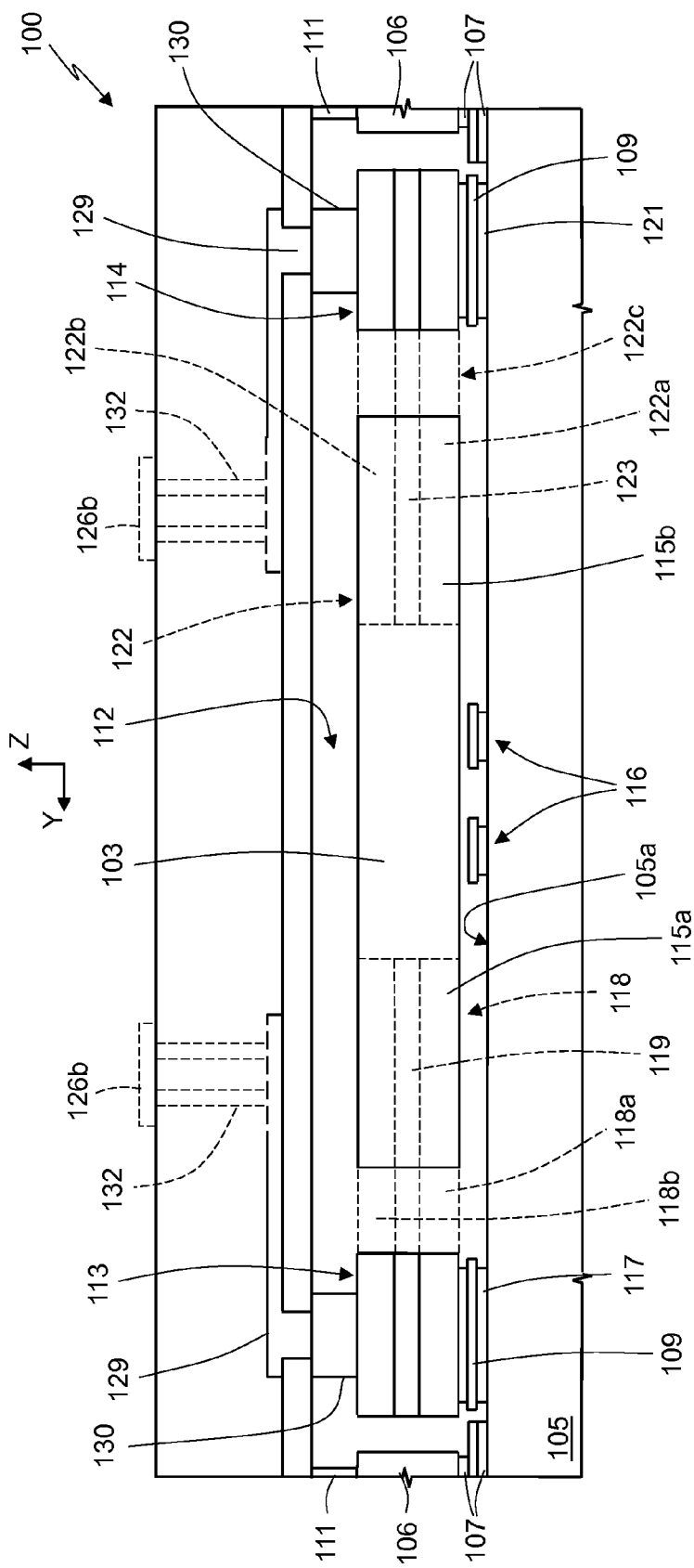
FIG. 15 is a cross-sectional view through the sensor of FIG. 13, taken along the line XV-XV of FIG. 13.

The set of fixed electrodes 113 is rigidly fixed to the substrate 102 by anchorages 117 made of dielectric material (FIGS. 14 and 15) and comprises electrode structures 118, which are also in the form of flat plates that extend in comb fashion towards the sensing mass 103 parallel to the plane defined by the axis Z and by the axis Y (see also FIG. 13). The movable electrodes 115a and the electrode structures 118 extend towards one another and are comb-fingered so that each movable electrode 115a has a portion arranged between a respective pair of electrode structures 118.

Each electrode structure 118 comprises a respective first fixed electrode 118a and a respective second fixed electrode 118b, both made of polycrystalline silicon and mutually insulated by a dielectric region 119. The first fixed electrode 118a, the dielectric region 119, and the second fixed electrode 118b form in this order a stack in a direction parallel to the axis Z (and hence perpendicular to the face 105a of the substrate 105).

The first fixed electrode 118a occupies a portion of the fixed electrode structure 118 that extends between the dielectric region 119 and a margin 118c facing the substrate 105.

The second fixed electrode 118b occupies, instead, a portion of the electrode structure 118 that extends between the dielectric region 119 and a margin 118d opposite to the margin 118c and facing the cap 110.

The set of fixed electrodes 114 is rigidly fixed to the substrate 102 by anchorages 121 made of dielectric material (FIGS. 14 and 15), in a position opposite to the set of fixed electrodes 113 with respect to the movable mass 103. The set of fixed electrodes 114 comprises electrode structures 122, which are also in the form of flat plates that extend in comb fashion towards the sensing mass 103 parallel to the plane defined by the axis Z and by the axis Y and perpendicular to the face 105a of the substrate 105 (see also FIG. 13). The movable electrodes 115b and the electrode structures 122 extend towards one another and are comb-fingered so that each movable electrode 115b has a portion arranged between a respective pair of electrode structures 122.

Each electrode structure 122 comprises a respective first fixed electrode 122a and a respective second fixed electrode 122b, both made of polycrystalline silicon and mutually insulated by a dielectric region 123. The first fixed electrode 122a, the dielectric region 123, and the second fixed electrode 122b form in this order a stack in a direction parallel to the axis Z. The first fixed electrode 122b (coplanar to the first fixed electrode 118a of a corresponding electrode structure 118) occupies a portion of the fixed electrode structure 122 that extends between the dielectric region 123 and a margin 122c facing the substrate 105. The fourth fixed electrode 122b (coplanar to the second fixed electrode 118b of a corresponding electrode structure 118) occupies, instead, a portion of the electrode structure 122 that extends between the dielectric region 123 and a margin 122d opposite to the margin 122c and facing the cap 110.

The first fixed electrodes 118a, 122a of the electrode structures 118, 122 are connected to respective electric connection lines 109, which are in turn fixed to the substrate 102 by the anchorages 117.

The second fixed electrodes 118b, 122b of the electrode structures 118, 122 are connected to respective electric connection lines 129 provided in the cap 110. The connection is obtained on a side 111a of the cap delimiting the cavity 112 by connection regions 130, which are defined by portions of the bonding layer 111.

Figure 16:
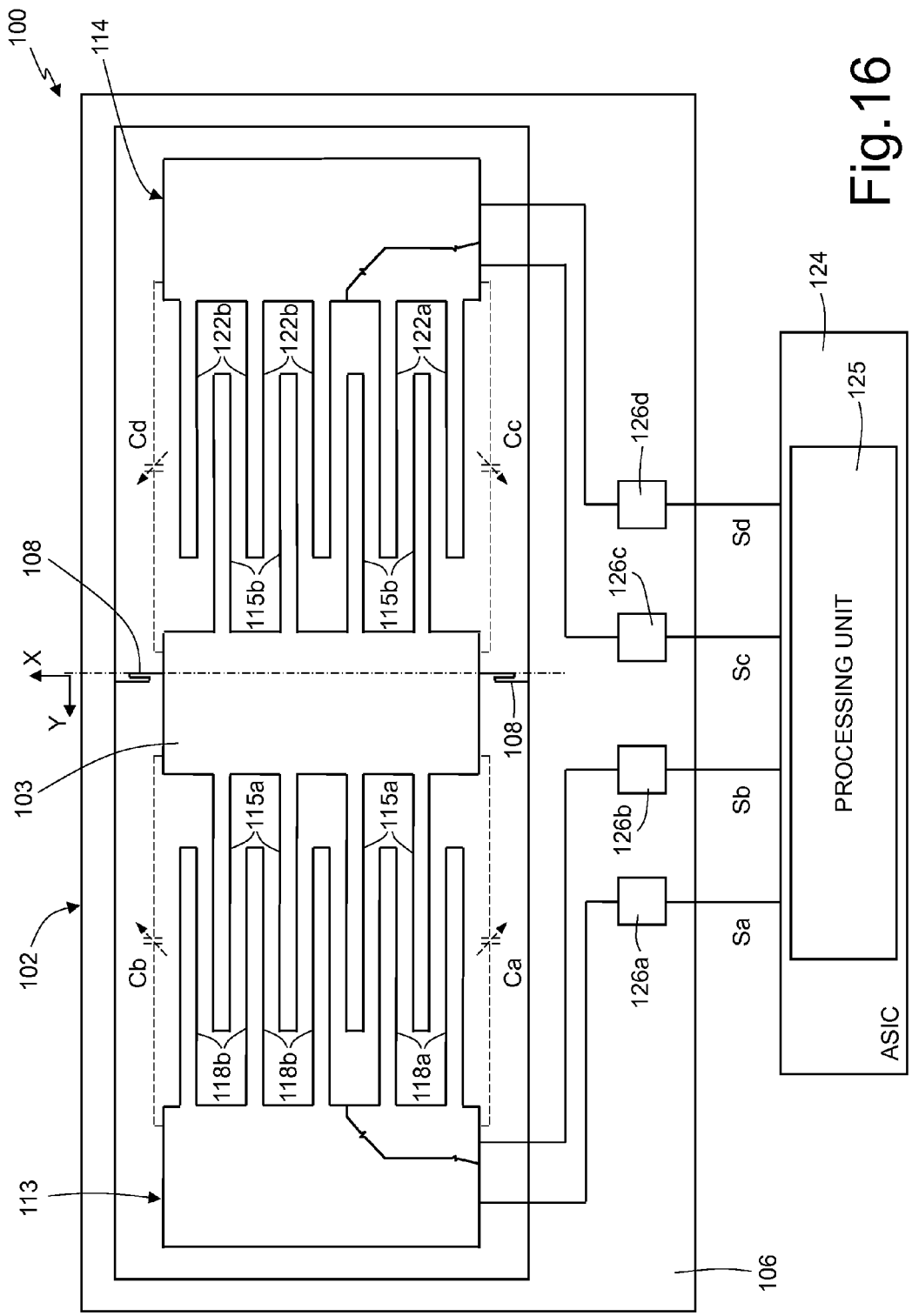
FIG. 16 is a simplified electric diagram of the sensor of FIG. 13.

As illustrated in a simplified way in FIG. 16, the first fixed electrodes 118a and the second fixed electrodes 118b of the electrode structures 118 are capacitively coupled to respective movable electrodes 115a of the sensing mass 3 and define with the latter respective capacitors that have overall capacitances Ca, Cb. The third fixed electrodes 122a and the fourth fixed electrodes 122b of the fixed electrode structures 122 are capacitively coupled to respective movable electrodes 115b of the sensing mass 3 and define with the latter respective capacitors that have overall capacitances Cc, Cd. Furthermore, the fixed electrodes 118a, 118b, 122a, 122b are connected to respective contact pads 126a, 126b, 126c, 126d through the electric connection lines 109, 129 for supplying respective sensing signals Sa, Sb, Sc, Sd to a control device 124 equipped with a processing unit 125. The sensing signals Sa, Sb, Sc, Sd indicate the overall capacitances Ca, Cb, Cc, Cd of the respective capacitors. For simplicity, in FIG. 16 the contact pads 126a, 126b, 126c, 126d are represented as if they were arranged all on the supporting structure 2. In one embodiment, for example, the pads 126c, 126d may be provided on the cap 110 and connected to the respective electric connection lines 129 through plugs 132, obtained by TSV (Through Silicon Vias) technology.

The processing unit 125 is configured to determine a first observed quantity Q' (in the embodiment described, acceleration along the axis Z) and a second observed quantity Q" (in the embodiment described acceleration along the axis Y) using the sensing signals Sa, Sb, Sc, Sd. More precisely, the first observed quantity Q' is determined by the processing unit 125 by combining the signals Sa, Sb, Sc, Sd in a first resulting signal Sr', which is indicative of the rotation of the sensing mass 3 about the axis X. The first resulting signal Sr', which is used by the processing unit 125 to determine the first observed quantity Q', is calculated as $$Sr'=(Sa-Sb)-(Sc-Sd)$$

The second observed quantity Q" is, instead, determined by the processing unit 125 by combining the signals Sa, Sb, Sc, Sd in a second resulting signal Sr", which is indicative of the translation of the sensing mass 3 along the axis Y. The second resulting signal Sr", which is used by the processing unit 125 to determine the second observed quantity Q", is calculated as $$Sr''=(Sa+Sb)-(Sc+Sd)$$

The use of capacitive couplings and the conformation of the electrode structures 118, 122, together with the reading of a differential type described, enable amplification of the effects of the displacements of the sensing mass 3 on the overall capacitances Ca, Cb, Cc, Cd and a consequent increase in sensitivity.

Modifications and variations may be made to the sensor and to the process described, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical sensor comprising:
a supporting structure having a substrate and electrode structures anchored to the substrate, each electrode structure including a first fixed electrode, a second fixed electrode, and a dielectric region, the first fixed electrode and the second fixed electrode being mutually insulated by the dielectric region and arranged in succession in a direction substantially perpendicular to a face of the substrate; and
a sensing mass of a continuous and uniform material movable with respect to the supporting structure so that a distance between the sensing mass and the substrate is variable, the sensing mass including movable electrodes capacitively coupled to the electrode structures.

2. The sensor according to claim 1, wherein the electrode structures and the movable electrodes are in the form of flat plates facing one another and substantially perpendicular to the face of the substrate.

3. The sensor according to claim 1, wherein in each electrode structure the first fixed electrode occupies a portion of the electrode structure that extends between the dielectric region and a first margin facing the substrate and the second fixed electrode occupies a portion of the electrode structure that extends between the dielectric region and a second margin opposite to the first margin.

4. The sensor according to claim 1, wherein the movable electrodes and the electrode structures are comb-fingered.

5. The sensor according to claim 1, wherein the sensing mass is rotatable about an axis parallel to the face of the substrate and perpendicular to the movable electrodes and to the electrode structures.

6. The sensor according to claim 5, wherein the axis is a non-barycentric axis.

7. The sensor according to claim 1, wherein the sensing mass is coupled to the supporting structure and allows translation along an axis perpendicular to the face of the substrate.

8. The sensor according to claim 1, wherein the movable electrodes project from a side of the sensing mass towards the electrode structures.

9. The sensor according to claim 1, wherein:
the movable electrodes include first movable electrodes and second movable electrodes, extending in opposite directions from the sensing mass;
the electrode structures include first electrode structures and second electrode structures that extend towards respectively the first movable electrodes and the second movable electrodes;
the first electrode structures face respective first movable electrodes;
the second electrode structures face respective second movable electrodes and include each a third fixed electrode and a fourth fixed electrode mutually separated by a further dielectric region and arranged in succession in a direction substantially perpendicular to the face of the substrate.

10. A package comprising:
a sensor including:
a supporting structure having a substrate and electrode structures anchored to the substrate, each electrode structure including a first fixed electrode, a second fixed electrode, and a dielectric region, the first fixed electrode and the second fixed electrode being mutually insulated by the dielectric region and arranged in succession in a direction substantially perpendicular to a face of the substrate; and
a sensing mass of a continuous and uniform material, movable with respect to the supporting structure so that a distance between the sensing mass and the substrate is variable, the sensing mass including movable electrodes capacitively coupled to the electrode structures, the movable electrodes being entirely of a conductive material; and
a control device coupled to the electrode structures and configured to receive a first sensing signal, indicative of a first capacitance between the movable electrodes and the first fixed electrodes, and a second sensing signal, indicative of a second capacitance between the movable electrodes and the second fixed electrodes, the control device being configured to determine a first resulting signal from the difference between the first sensing signal and the second sensing signal.

11. The package according to claim 10, comprising a cap joined to the supporting structure and to form a cavity in which the sensing mass is accommodated, and contact pads coupled to the electrode structures through electric connection lines, wherein at least some of the electric connection lines are embedded in the cap.

12. The package according to claim 11, wherein some of the electric connection lines are embedded in the supporting structure and are coupled to the first fixed electrodes and the electric connection lines embedded in the cap are coupled to the second fixed electrodes.

13. The package according to claim 11, wherein some of the electric connection lines are embedded in the supporting structure and are coupled to the first fixed electrodes and the electric connection lines embedded in the cap are coupled to the second fixed electrodes.

14. A package
a sensor including:
a supporting structure having a substrate and electrode structures anchored to the substrate, each electrode structure including a first fixed electrode, a second fixed electrode, and a dielectric region, the first fixed electrode and the second fixed electrode being mutually insulated by the dielectric region and arranged in succession in a direction substantially perpendicular to a face of the substrate; and
a sensing mass, movable with respect to the supporting structure so that a distance between the sensing mass and the substrate is variable, the sensing mass including movable electrodes capacitively coupled to the electrode structures; and
a control device coupled to the electrode structures and configured to receive a first sensing signal, indicative of a first capacitance between the movable electrodes and the first fixed electrodes, and a second sensing signal, indicative of a second capacitance between the movable electrodes and the second fixed electrodes, the control device being configured to determine a first resulting signal from the difference between the first sensing signal and the second sensing signal, wherein the control device is coupled to the second electrode structures and configured to receive a third sensing signal, indicative of a third capacitance between the second movable electrodes and the third fixed electrodes, and a fourth sensing signal, indicative of a fourth capacitance between the second movable electrodes and the fourth fixed electrodes;
wherein the control device is configured to determine, in a first operation mode, the first resulting signal from the relationship:

$$Sr'=(Sa-Sb)-(Sc-Sd)$$

and, in a second operation mode, a second resulting signal from the relationship:

$$Sr''=(Sa+Sb)-(Sc+Sd)$$

where $Sr'$ is the first resulting signal, $Sr''$ is the second resulting signal and $Sa$, $Sb$, $Sc$, $Sd$ are respectively the first, the second, the third and the fourth sensing signal.

15. The package according to claim 14, comprising:
a cap joined to the supporting structure and forming a cavity in which the sensing mass is accommodated; and
contact pads coupled to the electrode structures through electric connection lines, wherein at least some of the electric connection lines are embedded in the cap.

16. A process for manufacturing a microelectromechanical sensor, comprising:
forming electrode structures that are anchored to a substrate, each electrode structure including a first fixed electrode, a second fixed electrode, and a dielectric region, the first fixed electrode and the second fixed electrode being mutually insulated by the dielectric region and arranged in succession in a direction substantially perpendicular to a face of the substrate; and
forming a sensing mass that is movable with respect to the substrate, wherein forming the sensing mass includes forming a gap between the sensing mass and the substrate that is variable, the sensing mass including movable electrodes of a continuous and uniform material capactively coupled to the electrode structures.

17. The process according to claim 16, wherein forming the gap comprising etching a sacrificial layer between the moveable mass and the substrate.

18. A microelectromechanical sensor comprising:
a substrate;
a plurality of first electrodes that are fixed to the substrate; and
a sensing mass that includes a plurality of second electrodes that are moveable relative to the substrate, the second electrodes being capacitively coupled to the first electrodes, one of the first electrodes and the second electrodes is an electrode structure having an upper electrode region, a lower electrode region and a dielectric region isolating the upper electrode region from the lower electrode region, and the other of the first electrodes and the second electrodes being of a continuous and uniform material.

19. The sensor according to claim 18, wherein the first electrode is the electrode structure having the upper electrode region, the lower electrode region and the dielectric region isolating the upper electrode region from the lower electrode region.

20. The sensor according to claim 19, wherein a side surface of the upper electrode region, the lower electrode region, and the dielectric region faces a side surface of the second electrodes.

21. The sensor according to claim 18, wherein the upper electrode region, the dielectric region, and the lower electrode region are stacked in a direction that is perpendicular to a face of the substrate.

* * * * *